US011380809B2

(12) United States Patent
Choi et al.

(10) Patent No.: US 11,380,809 B2
(45) Date of Patent: Jul. 5, 2022

(54) BLIND BLADE ASSEMBLY FOR SOLAR PHOTOVOLTAIC POWER GENERATION

(71) Applicant: LG HAUSYS, LTD., Seoul (KR)

(72) Inventors: Chul Jun Choi, Seoul (KR); Jong Tae Kim, Seoul (KR); Seung Jung Lee, Seoul (KR)

(73) Assignee: LG Hausys, Ltd., Seoul (KR)

(*) Notice: Subject to any disclaimer, the term of this patent is extended or adjusted under 35 U.S.C. 154(b) by 105 days.

(21) Appl. No.: 16/631,670

(22) PCT Filed: Feb. 27, 2018

(86) PCT No.: PCT/KR2018/002411
§ 371 (c)(1),
(2) Date: Jan. 16, 2020

(87) PCT Pub. No.: WO2018/221841
PCT Pub. Date: Dec. 6, 2018

(65) Prior Publication Data
US 2020/0185554 A1    Jun. 11, 2020

(30) Foreign Application Priority Data
Jun. 1, 2017 (KR) .......................... 10-2017-0068212

(51) Int. Cl.
*H01L 31/042* (2014.01)
*H02S 20/22* (2014.01)
(Continued)

(52) U.S. Cl.
CPC .............. *H01L 31/042* (2013.01); *E06B 9/26* (2013.01); *H01L 31/0224* (2013.01);
(Continued)

(58) Field of Classification Search
CPC . E06B 9/26; H02S 40/36; H02S 30/00; H02S 20/20; H02S 20/22; H02S 40/22; H01L 31/0224; H01L 31/042
See application file for complete search history.

(56) References Cited

U.S. PATENT DOCUMENTS

| 8,678,069 B2 | 3/2014 | Choi et al. |
| 2011/0240094 A1 | 10/2011 | Hoffmann |
| 2018/0030781 A1* | 2/2018 | Hall ........................ H02S 20/22 |

FOREIGN PATENT DOCUMENTS

| CN | 102482915 A | 5/2012 |
| JP | 2008-7934 A | 1/2008 |

(Continued)

OTHER PUBLICATIONS

Machine translation of KR-20160045458-A, Hwang Tae Yon. (Year: 2016).*
(Continued)

*Primary Examiner* — Mayla Gonzalez Ramos
(74) *Attorney, Agent, or Firm* — Dentons US LLP

(57) ABSTRACT

The present invention relates to a blind blade assembly for solar photovoltaic power generation including solar cells installed on one side thereof to enable solar photovoltaic power generation. In the blind blade assembly of the present invention, solar cells are provided in a prefabricated form, allowing the solar cells to be replaced and repaired individually.

The blind blade assembly for solar photovoltaic power generation according to the present invention includes a blade frame 210 provided with a mounting groove 211; a plurality of solar cell panels 220 disposed in the longitudinal direction in the mounting groove 211; and fixing members 230 for connecting electrodes 223 between the solar cell panels 220 and for fixing seams.

7 Claims, 7 Drawing Sheets

(51) Int. Cl.
*H02S 40/22* (2014.01)
*H02S 40/36* (2014.01)
*E06B 9/26* (2006.01)
*H01L 31/0224* (2006.01)

(52) U.S. Cl.
CPC .............. *H02S 20/22* (2014.12); *H02S 40/22* (2014.12); *H02S 40/36* (2014.12)

(56) References Cited

FOREIGN PATENT DOCUMENTS

| | | | | |
|---|---|---|---|---|
| JP | 2008007934 A | * | 1/2008 | ............ H02S 20/26 |
| JP | 2014136928 A | | 7/2014 | |
| KR | 10-2011-0087202 A | | 8/2011 | |
| KR | 10-2012-0129271 A | | 11/2012 | |
| KR | 10-1364497 B1 | | 4/2014 | |
| KR | 10-2015-0028865 A | | 3/2015 | |
| KR | 20150028865 A | * | 3/2015 | |
| KR | 1020150130180 A | | 11/2015 | |
| KR | 10-2016-0045458 A | | 4/2016 | |
| KR | 20160045458 A | * | 4/2016 | |
| KR | 10-2016-0095331 A | | 8/2016 | |

OTHER PUBLICATIONS

Machine translation of KR-20150028865-A, Hwang Tae Yon. (Year: 2015).*

Machine translation of JP-2008007934-A, Ishiguro, Eiichi. (Year: 2008).*

* cited by examiner

【FIG. 1】
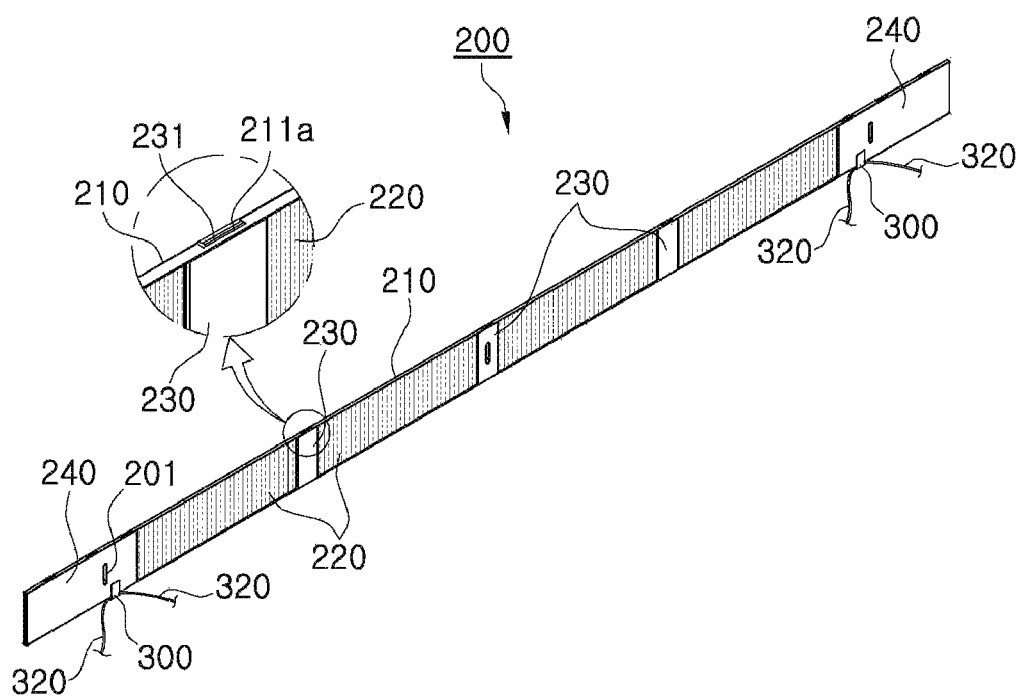

【FIG. 2】
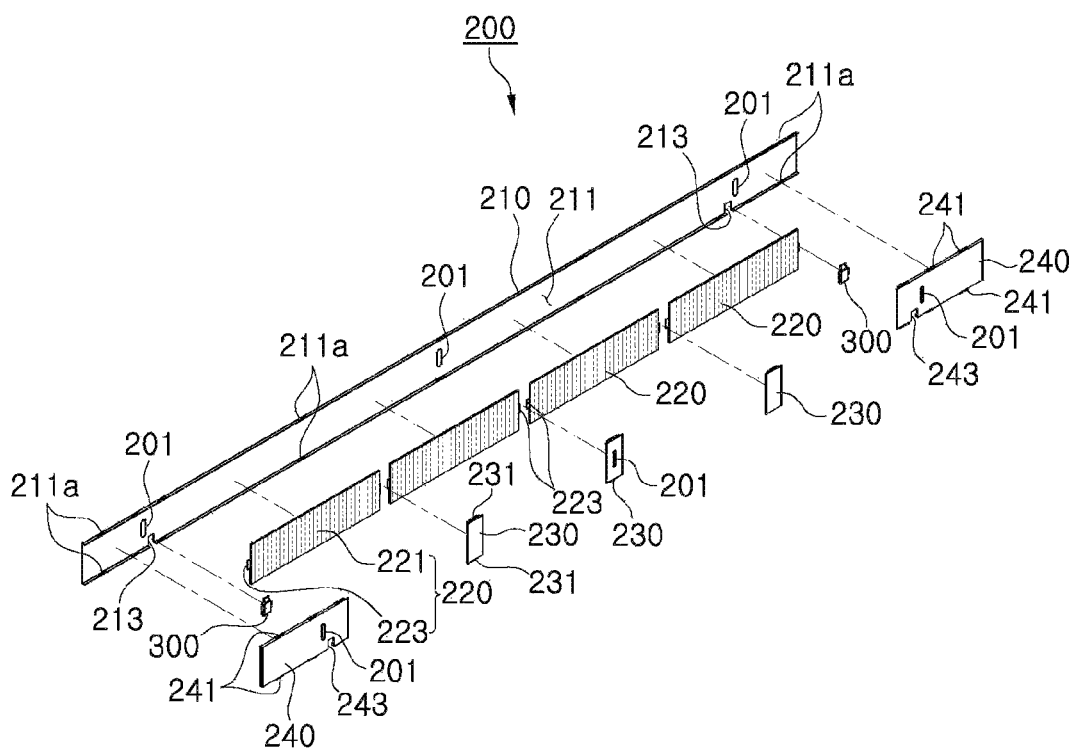
【FIG. 3】
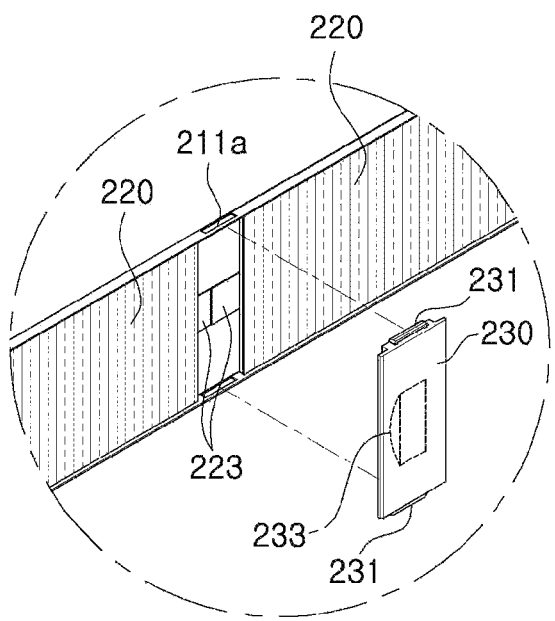

[FIG. 4]
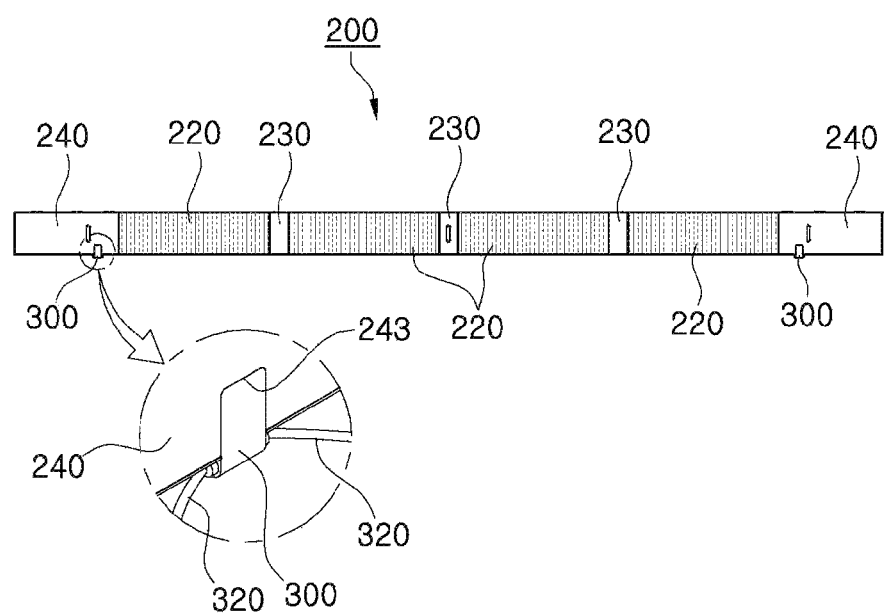

[FIG. 5]
(a)
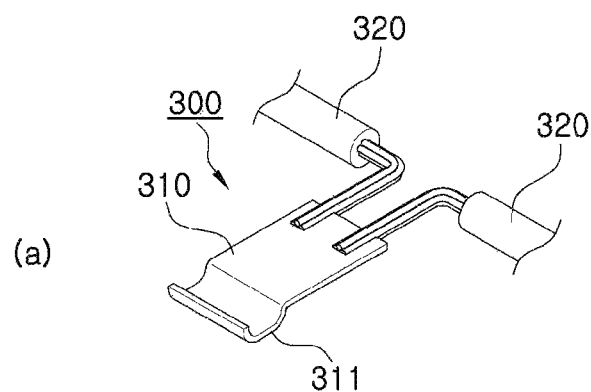
(b)
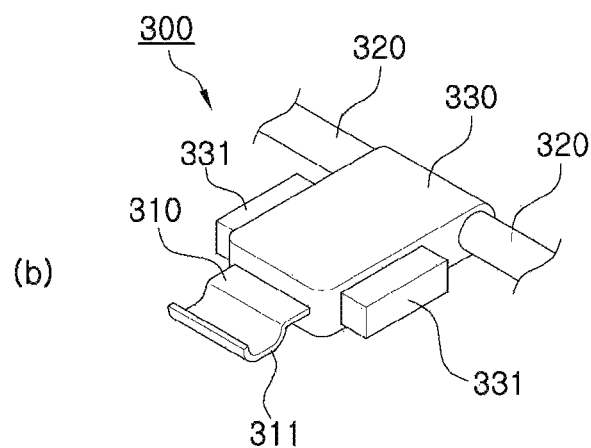

[FIG. 6]
(a) 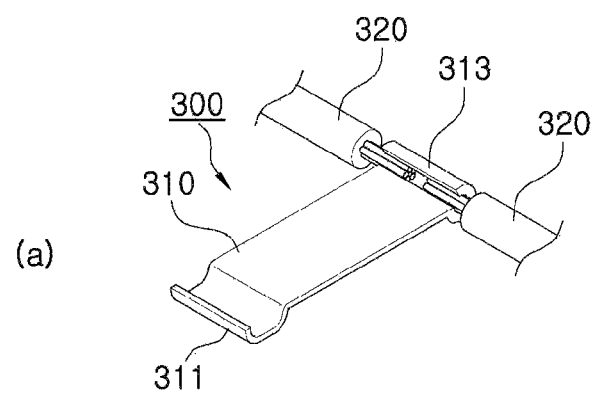
(b) 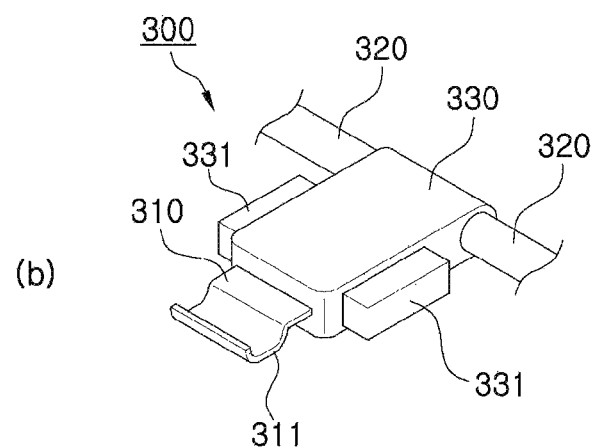

[FIG. 7]
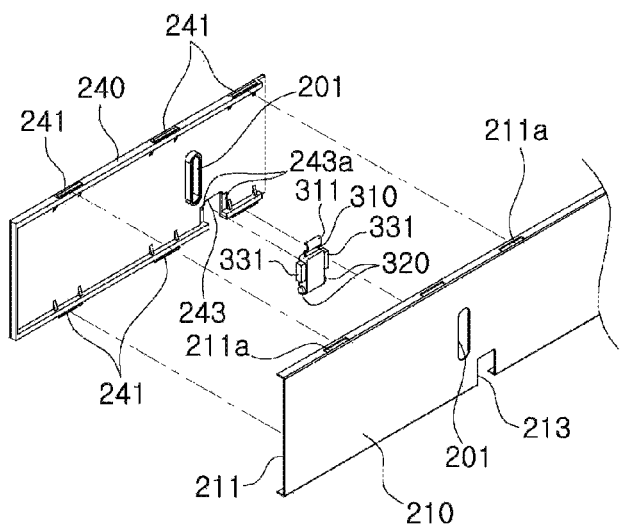
[FIG. 8]
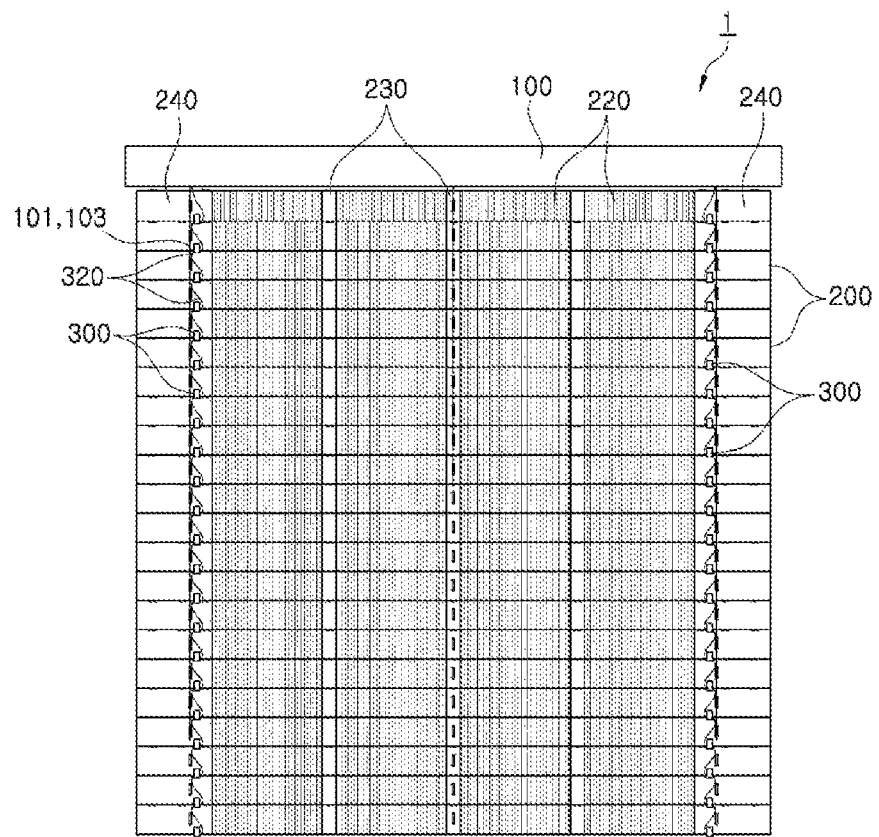

[FIG. 9]
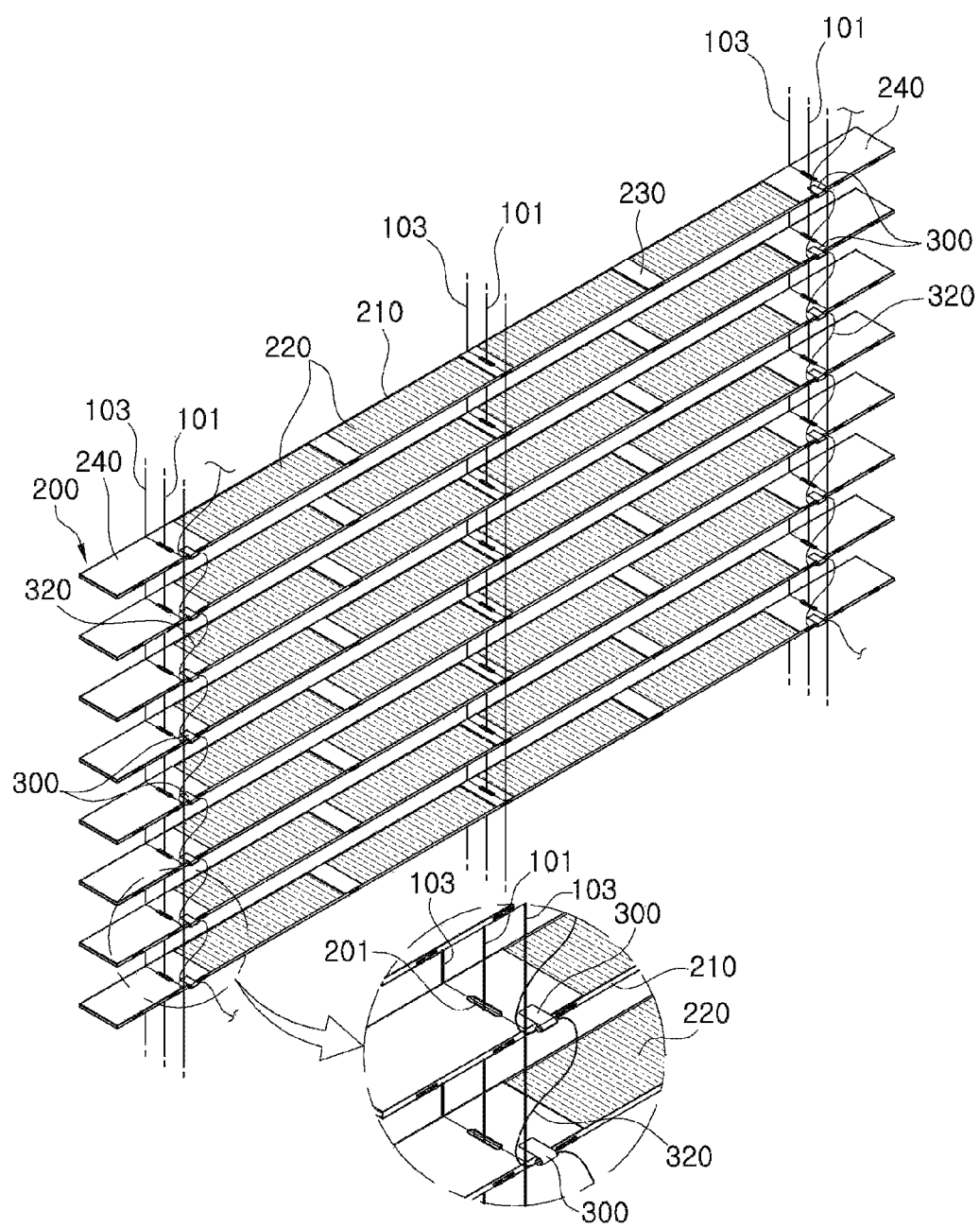

BLIND BLADE ASSEMBLY FOR SOLAR PHOTOVOLTAIC POWER GENERATION

This application is a National Stage Entry of International Application No. PCT/KR2018/002411, filed on Feb. 27, 2018, and claims the benefit of and priority to Korean Application No. 10-2017-0068212, filed on Jun. 1, 2017, all of which are hereby incorporated by reference in their entirety for all purposes as if fully set forth herein.

TECHNICAL FIELD

The present invention relates to a blind blade assembly for solar photovoltaic power generation. More particularly, the present invention relates to a blind blade assembly for solar photovoltaic power generation including solar cells installed on one side thereof to enable solar photovoltaic power generation. In the blind blade assembly of the present invention, solar cells are provided in a prefabricated form, allowing the solar cells to be replaced and repaired individually.

BACKGROUND ART

Recently, due to environmental pollution and depletion of fossil fuels, development of eco-friendly alternative energy sources and diversification of energy sources are emerging as international issues.

Accordingly, solar energy is attracting attention as an important alternative energy source, and interest in solar cells that convert sunlight into energy is increasing. In addition, with realization of low-cost solar cells, the scale of a global market associated with solar cells is rapidly increasing.

Along with this trend, Korean Patent No. 10-1364497 disclosing a blind for solar photovoltaic power generation that generates power using daytime sunlight was filed on Apr. 3, 2014.

Specifically, a conventional blind blade assembly (slat) for manufacture of a blind for solar photovoltaic power generation includes a blade frame provided with a mounting groove for mounting solar cells and provided with lead wires connected to the terminals of solar cells, a transparent reinforcement film for covering the blade frame to protect the mounted solar cells, and a wire connector for electrically connecting the lead wires and outgoing lines.

However, in the manufacture of such a conventional blind blade for solar photovoltaic power generation, in consideration of manufacturing convenience, solar cells and a transparent reinforcement film are sequentially laminated on a blade frame, and then a process of integrating the blade frame with the solar cells and the transparent reinforcement film is performed. Accordingly, when a defect occurs during manufacture or use, replacement or repair is not easy.

DISCLOSURE

Technical Problem

Therefore, the present invention has been made in view of the above problems, and it is one object of the present invention to provide a blind blade assembly for solar photovoltaic power generation including solar cells installed on one side thereof to enable solar photovoltaic power generation. In the blind blade assembly of the present invention, solar cells are provided in a prefabricated form, allowing the solar cells to be replaced and repaired individually.

Technical Solution

In accordance with one aspect of the present invention, provided is a blind blade assembly for solar photovoltaic power generation including a blade frame provided with a mounting groove; a plurality of solar cell panels disposed in the longitudinal direction in the mounting groove; and fixing members for connecting electrodes between the solar cell panels and for fixing seams.

Advantageous Effects

According to the present invention, a plurality of solar cell panels is installed on one side of a blind blade to enable solar photovoltaic power generation, and the solar cell panels are provided in a prefabricated form, allowing the solar cell panels to be replaced and repaired individually.

In particular, a blind according to the present invention is configured to meet the minimum specifications of a Korea micro-inverter that converts direct current generated by solar photovoltaic power generation into alternating current. The minimum specifications can be satisfied by connecting the solar cell panels in series to one blind blade and connecting the blind blades, which are installed below a fixing frame to be spaced apart from each other, in parallel.

DESCRIPTION OF DRAWINGS

FIG. 1 is a perspective view of a blind blade assembly for solar photovoltaic power generation according to the present invention.

FIG. 2 is an exploded perspective view of a blind blade assembly according to the present invention.

FIG. 3 illustrates an engaged state of a fixing member according to the present invention.

FIG. 4 illustrates an assembled state of a connector provided in a blind blade assembly according to the present invention.

FIGS. 5A and 5B are perspective views of a connector according to the present invention.

FIGS. 6A and 6B are perspective views of a connector according to another embodiment of the present invention.

FIG. 7 is a perspective view of a main portion where a connector is coupled to the blind blade assembly according to the present invention.

FIG. 8 illustrates a blind for solar photovoltaic power generation to which a blade assembly according to the present invention is applied.

FIG. 9 is a perspective view showing an installation state of a blind blade assembly according to the present invention.

BEST MODE

Hereinafter, the functions or constructions of preferred embodiments of the present invention will now be described more fully with reference to the accompanying drawings.

Here, when reference numerals are applied to constituents illustrated in each drawing, it should be noted that like reference numerals indicate like elements throughout the specification.

FIG. 1 is a perspective view of a blind blade assembly for solar photovoltaic power generation according to the present invention, and FIG. 2 is an exploded perspective view of a blind blade assembly according to the present invention.

Referring to FIGS. 1 and 2, a blind blade assembly 200 for solar photovoltaic power generation according to a preferred embodiment of the present invention includes a blade frame 210, a plurality of solar cell panels 220, fixing members 230, and side covers 240.

The configuration of the present invention is described in detail as follows.

The blade frame 210 constitutes the main body of the blind blade assembly 200, and one side of the blade frame 210 is provided with a mounting groove 211 in which the solar cell panels 220 to be described later are installed. The blade frame 210 may be formed of a synthetic resin or aluminum material. In the present invention, in consideration of durability or ease of assembly, the blade frame 210 may be formed of an aluminum material, and the present invention is described based on this case. In this case, the inner surface of the mounting groove 211 is preferably insulated through plating or film attachment.

In the mounting groove 211, the solar cell panels 220 are arranged in a row in the longitudinal direction. Specifically, the top surface of each of the solar cell panels 220 is provided with solar cells to form a condensing surface 221, and both sides of the bottom surface of each of the solar cell panels 220 are provided with back contact type (+)/(−) electrodes 223.

In this case, solar cells provided on the condensing surface 221 of the solar cell panel 220 are arranged in a direction perpendicular to the longitudinal direction of the solar cell panel 220. Accordingly, even when shade occurs in a horizontal direction on a portion of the top or bottom of the condensing surface 221 by the neighboring blind blade assembly 200, power generation in the solar cell panels 220 is not affected. That is, since the long sides of the strip-shaped unit cells of the solar cell panel 220 are arrayed in the width direction of the blind blade assembly 200, the entire area of the solar cells is not shaded. Accordingly, the output of the solar cell panel 220 may be reduced in accordance with the ratio of shaded areas. However, since none of solar cells connected in series are completely shaded, total output may be prevented from being significantly reduced.

The fixing members 230 serve to connect the electrodes 223 between the solar cell panels 220 continuously disposed in the mounting groove 211. In addition, the fixing members 230 serve to fix the positions of the solar cell panels 220.

Referring to FIG. 3, each of the fixing members 230 is provided with fitting protrusions 231 corresponding to fitting holes 211a provided at both sides of the mounting groove 211 of the blade frame 210 so that the fitting protrusions 231 are fitted into the fitting holes 211a and the fixing member 230 is coupled to the blade frame 210. The fixing members 230 may be formed of a synthetic resin.

In this case, an inclined surface is formed at the tip of each of the fitting protrusions 231, and the fitting holes 211a are formed in sidewalls formed by bending both sides of the blade frame 210 formed of an aluminum material. Accordingly, the fitting protrusions 231 of the fixing member 230 may be elastically fitted to the fitting holes 211a. However, the present invention is not limited to this coupling method, and the fitting protrusions 231 of the fixing members 230 may be configured according to a snap-fit coupling method.

In addition, a pressurization protrusion 233 may be formed on one surface of the fixing member 230 so that the pressurization protrusion 233 protrudes therefrom. When the fixing member 230 is coupled to the blade frame 210, the pressurization protrusion 233 pressurizes a connection point of the electrodes 223 between the solar cell panels 220 to connect the electrodes 223.

That is, for convenience of assembly, the solar cell panels 220 are disposed so that the connection parts of the electrodes 223 overlap each other, and the overlapping connection parts of the electrodes 223 are connected to each other by pressurization of the pressurization protrusion 233 during assembly of the fixing members 230. Accordingly, instead of fixing the electrodes 223 between the solar cell panels 220 by soldering, the electrodes 223 may be connected to each other simply by assembling the fixing members 230.

Referring to FIG. 4, the side covers 240 are installed at both sides of the blade frame 210 to fix the ends of the solar cell panels 220 disposed on both sides of the mounting groove 211. Specifically, the side covers 240 are provided with fitting protrusions 241 corresponding to the fitting holes 211a disposed at both sides of the mounting groove 211 of the blade frame 210 so that the fitting protrusions 241 are fitted into the fitting holes 211a and the side covers 240 are coupled to the blade frame 210. The side covers 240 may be formed of a synthetic resin.

In this case, connectors 300 for electrically connecting the blind blade assemblies 200 are provided inside the side covers 240.

Referring to FIG. 5, each of the connectors 300 includes a connecting unit 310 formed of a conductive material, one side of which is connected to the electrodes 223 of the solar cell panels 220; wires 320 integrally formed at the other side of the connecting unit 310 and electrically connected to the neighboring blind blade assembly 200; and a body 330 formed of an insulating material for surrounding a portion where the connecting unit 310 and the wires 320 are connected.

In this case, a pressurization unit 311 is provided at one side of the connecting unit 310 so as to pressurize the top surfaces of the electrodes 223 of the solar cell panels 220 and connect the electrodes 223 during assembly of the connector 300. The pressurization unit 311 may be formed in a semicircular shape bent downward.

That is, the connectors 300 may be easily connected to the electrodes 223 of the solar cell panels 220 through configuration of the pressurization unit 311 instead of being connected to the electrodes 223 of the solar cell panels 220 through separate soldering. However, the present invention is not limited to this configuration, and various configurations may be applied as long as the configurations allow easy connection with the electrodes 223.

In addition, the wires 320 may be integrally formed on the other side of the connecting unit 310 by soldering. In another embodiment, as shown in FIG. 6, the wires 320 may be fitted into a ring 313 formed in a bent shape on the other side of the connecting unit 310, and then the ring 313 may be pressed to fix the wires 320.

In addition, the body 330 prevents water or moisture from entering a portion where the connecting unit 310 and the wires 320 are connected, and may be formed integrally by insert injection molding.

Referring to FIG. 7, installation grooves 213 and 243 are respectively formed in the blade frame 210 and each of the side covers 240 coupled to the blade frame 210 so that the connector 300 is installed between the blade frame 210 and the side cover 240 during assembly of the side cover 240. Specifically, mounting protrusions 331 are formed on both sides of the body 330, coupling grooves 243a are formed in the installation groove 243 of the side cover 240, and the mounting protrusions 331 are mounted in the coupling grooves 243a, thereby preventing the body 330 from shaking.

Next, a blind 1 for solar photovoltaic power generation to which the blind blade assembly 200 according to the present invention described above is applied will be described.

Referring to FIG. 8, the blind 1 for solar photovoltaic power generation according to the present invention includes a fixing frame 100 and the blind blade assemblies 200 installed under the fixing frame 100 so as to be spaced apart from each other.

The fixing frame 100 is installed on a ceiling or a window frame adjacent to a window. The fixing frame 100 is provided with a lifting adjusting line (not shown) for adjusting lifting of lifting lines 101 and a tilting adjusting tool (not shown) for adjusting the angles of the blind blade assemblies 200 by manipulating tilting lines 103.

For reference, the lifting adjusting line adjusts rotation of a drum (not shown) to which one end of each of the lifting lines 101 in the fixing frame 100 is fixed. As the lifting lines 101 are wound by rotation of the drum, the lowermost blind blade assembly 200 is lifted upwards, and thus the blind blade assemblies 200 located at the upper side thereof are lifted sequentially while overlapping each other.

The tilting adjusting tool adjusts rotation of the drum in the fixing frame 100 by about half a turn clockwise or counterclockwise. According to operation of the tilting adjusting tool, either one of the tilting lines 103 formed in a ladder shape is pulled up, and thus the angles of the blind blade assemblies 200 fixed to the tilting lines 103 are adjusted.

In this case, the lifting adjusting line and the tilting adjusting tool are general components used in a blind. The present invention is not limited to the above-described operating manners, and any structures capable of easily adjusting lifting or angle of the blind blade assemblies 200 may be used without limitation.

Referring to FIG. 9, the blind blade assemblies 200 are installed below the fixing frame 100 so as to be spaced apart from each other. In this case, the blind blade assemblies 200 are linked to the fixing frame 100 via the lifting lines 101 and the tilting lines 103, and one surface of each of the blind blade assemblies 200 is provided with the solar cell panels 220. In this case, the lifting lines 101 are installed to penetrate through through-holes 201 formed in the longitudinal direction of the blind blade assembly 200.

In the blind 1 for solar photovoltaic power generation described above, the solar cell panels 220 are continuously installed on one side of the blind blade assembly 200 to enable solar photovoltaic power generation. In this case, the solar cell panels 220 are provided in a prefabricated form, allowing the solar cell panels 220 to be replaced and repaired individually.

In particular, the blind 1 according to the present invention is configured to meet the minimum specifications of a Korea micro-inverter that converts direct current generated by solar photovoltaic power generation into alternating current. The minimum specifications may be satisfied by connecting the solar cell panels 220 in series to one blind blade assembly 200 and connecting the blind blade assemblies 200, which are installed below the fixing frame 100 to be spaced apart from each other, in parallel.

For example, in the blind 1 according to the present invention, four solar cell panels 220 are connected in series to one blind blade assembly 200, and 35 blind blade assemblies 200 are connected in parallel. In addition, by connecting two sets of the blind 1 in parallel, the current specifications (20 to 50 Vdc and 12 A) of a Korea micro-inverter may be satisfied. However, the present invention is not limited thereto, and various modifications may be made to meet the minimum specifications of an inverter applied to the blind 1 for solar photovoltaic power generation.

As described above, the present invention has been described with reference to certain preferred embodiments, but the present invention is not limited to the above-described embodiments, and various changes and modifications may be made without departing from the spirit of the present invention.

[Description of Symbols]

| | |
|---|---|
| 1: BLIND FOR SOLAR PHOTOVOLTAIC POWER GENERATION | |
| 100: FIXING FRAME | |
| 101: LIFTING LINES | 103: TILTING LINES |
| 200: BLIND BLADE ASSEMBLY | 201: THROUGH-HOLES |
| 210: BLADE FRAME | 211: MOUNTING GROOVE |
| 211a: FITTING HOLES | 213: INSTALLATION GROOVE |
| 220: SOLAR CELL PANELS | 221: CONDENSING SURFACE |
| 223: ELECTRODES | 230: FIXING MEMBERS |
| 231: FITTING PROTRUSIONS | 233: PRESSURIZATION PROTRUSION |
| 240: SIDE COVERS | 241: FITTING PROTRUSIONS |
| 243: INSTALLATION GROOVE: | 243a: COUPLING GROOVES |
| 300: CONNECTORS | 310: CONNECTING UNIT |
| 311: PRESSURIZATION UNIT | 313: RING |
| 320: WIRES | 330: BODY |
| 331: MOUNTING PROTRUSIONS | |

The invention claimed is:

1. A blind blade assembly for solar photovoltaic power generation, comprising:
   a blade frame provided with a mounting groove;
   a plurality of solar cell panels disposed in a longitudinal direction in the mounting groove; and
   fixing members for connecting electrodes between the solar cell panels and for fixing seams,
   wherein each of the fixing members is provided with fitting protrusions that are fitted into fitting holes provided at both sides of the mounting groove, and
   wherein a pressurization protrusion for pressurizing a connection point of the electrodes between the solar cell panels to connect the electrodes is formed to protrude from an inner surface of the fixing member, wherein the pressurization protrusion has a semicircular shape.

2. The blind blade assembly according to claim 1, further comprising side covers installed at both sides of the blade frame and responsible for fixing ends of the solar cell panels.

3. The blind blade assembly according to claim 1, wherein the blade frame is formed of an aluminum material, and an inner surface of the mounting groove is insulated through plating or film attachment.

4. The blind blade assembly according to claim 1, wherein a top surface of each of the solar cell panels is provided with solar cells to form a condensing surface, and both sides of a bottom surface of each of the solar cell panels are provided with the back contact type (+)/(−) electrodes.

5. The blind blade assembly according to claim 2, wherein each of the side covers is provided with fitting protrusions which are fitted into fitting holes provided at both sides of the mounting groove.

6. The blind blade assembly according to claim 2, wherein a connector for electrically connecting the solar cell panels is installed inside the side cover,
   wherein the connector comprises a connecting unit formed of a conductive material, one side of which is connected to the electrodes of the solar cell panels;

wires integrally formed at the other side of the connecting unit and electrically connected to the neighboring solar cell panels; and a body formed of an insulating material for surrounding a portion where the connecting unit and the wires are connected.

7. The blind blade assembly according to claim 6, wherein one side of the connecting unit is further provided with a pressurization unit formed in a bent shape so as to pressurize and connect the electrodes of the solar cell panels.

* * * * *